(12) United States Patent
Lee et al.

(10) Patent No.: US 8,305,728 B2
(45) Date of Patent: Nov. 6, 2012

(54) METHODS AND APPARATUS FOR COOLING ELECTRONIC DEVICES

(75) Inventors: Jean L. Lee, San Jose, CA (US); Richard Lidio Blanco, Jr., Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 302 days.

(21) Appl. No.: 12/827,421

(22) Filed: Jun. 30, 2010

(65) Prior Publication Data
US 2012/0002342 A1    Jan. 5, 2012

(51) Int. Cl.
*H01T 23/00* (2006.01)
(52) U.S. Cl. ..................................................... 361/231
(58) Field of Classification Search ................ None
See application file for complete search history.

(56) References Cited

U.S. PATENT DOCUMENTS

| | | | | |
|---|---|---|---|---|
| 4,139,879 | A * | 2/1979 | Laws ............................ | 361/230 |
| 4,549,639 | A * | 10/1985 | Hansen ...................... | 192/48.91 |
| 6,522,536 | B2 | 2/2003 | Brewer et al. | |
| 7,266,964 | B2 * | 9/2007 | Vogel et al. .................. | 62/259.2 |
| 7,416,902 | B2 * | 8/2008 | Pletcher et al. ............... | 436/174 |
| 7,839,634 | B2 * | 11/2010 | Ouyang ........................ | 361/691 |
| 2002/0126448 | A1 * | 9/2002 | Brewer et al. ................. | 361/687 |
| 2006/0169441 | A1 | 8/2006 | Schlitz | |
| 2006/0176664 | A1 * | 8/2006 | Casebolt ....................... | 361/687 |
| 2007/0157402 | A1 | 7/2007 | Caffarella | |
| 2008/0060794 | A1 * | 3/2008 | Wei ............................ | 165/109.1 |
| 2009/0001787 | A1 | 1/2009 | Lawall et al. | |
| 2009/0321044 | A1 * | 12/2009 | Hernon et al. ............... | 165/80.2 |
| 2009/0321056 | A1 | 12/2009 | Ran et al. | |

OTHER PUBLICATIONS

Jewell-Larsen, N. E., et al., "Electrohydrodynamic (EHD) Cooled Laptop", *25th IEEE Semi-Therm Symposium*, (2009), 7 pgs.

* cited by examiner

*Primary Examiner* — Stephen W Jackson
*Assistant Examiner* — Angela Brooks
(74) *Attorney, Agent, or Firm* — Park, Vaughan, Fleming & Dowler LLP

(57) ABSTRACT

Embodiments provide various apparatus and techniques for deflecting or redirecting a flow of ionized air generated from an ionic wind generator. In general, a deflection field generator can be located proximate to the path of the flow of ionized air. The deflection field generator is configured to generate an electromagnetic field, which deflects a least a portion of the flow of ionized air to a different path and may possibly increase local heat transfer.

18 Claims, 7 Drawing Sheets

METHODS AND APPARATUS FOR COOLING ELECTRONIC DEVICES

FIELD

The present disclosure relates generally to new methods and apparatus for cooling electronic devices, and more particularly, relates to methods and apparatuses for cooling the electronic devices by deflecting a flow of ionized air generated by an ionic wind generator.

BACKGROUND

Many modern electronic systems generate a large amount of heat, and a variety of different cooling mechanisms may be used to cool these electronic systems. For personal electronic systems, such as computers and other relatively transportable electronic systems, the cooling devices in use today are primarily mechanically-based devices, such as electric fans and heat sinks. A cooling device that has been proposed for use in such systems is an ionic wind generator, which generates airflow based on the ionization of air molecules. A limitation of currently-proposed ionic wind generator cooling systems for such devices (and for other conventional cooling devices as well) is that the generated airflow, from a first electrode toward a second electrode is limited to a linear path which is essentially static, and thus can only cool a specific region of an electronic system; particularly, only the regions that are in, or immediately adjacent, the path of the airflow can be cooled.

While the size, placement, and relative orientation of the two electrodes can be established to provide a linear path of a desired direction and dimension so as to provide a selected degree of airflow-based cooling in that region; such systems inherently involve compromises in terms of either performance or cooling capability. For example, because of the fixed path, the ionic wind generator cooling systems must be designed to provide airflow of a sufficient dimension, and in a sufficient amount, to meet all foreseeable cooling needs. However, as can be seen from the example of a computer system (such as, for example, a laptop computer), there may be substantial differences in the usage of the processors and other heat sources in the computer at different times, and thus a cooling system designed to meet the highest-level cooling needs may be using more power than would be necessary at times of relatively lower level cooling needs. Additionally, some components within the example laptop computer may not always be in substantial use, such as a graphics processor, that exacerbate heat generation. Thus, airflow directed to such a component when it is not heavily used, and is thus generating little heat, again is requiring a greater energy budget that would be otherwise required.

Thus, the limitations of such currently proposed ionic wind generator cooling systems for many electronic devices are limited relative to the variable cooling needs of many such systems.

SUMMARY

The present disclosure identifies as various embodiments of methods and apparatus for deflecting or redirecting a flow of ionized air, such as that generated by an ionic wind generator. As will be described in more detail later herein, in the embodiments described herein, a deflection field is generated proximate the path of the flow of ionized air, and is used to deflect at least some portion of the path of the flow of the ionized air to a different path. In some embodiments, the deflection field is established by a deflection field generator that is configured to generate an electric field and/or a magnetic field, sufficient to deflect at least a portion of the flow of ionized air to a different path. In some examples, the deflection field may be used essentially continuously to deflect at least a portion of the ionized airflow. However, many other contemplated examples of the invention include a deflection field generator which is selectively controllable to provide some deflection of the airflow to the alternate path.

In some cases, this selective control will be in response to one or more monitored parameters. As just one example of such selective control, a parameter of a processing device (as defined later herein) may be monitored and the deflection field generator may be activated in reference to some threshold associated with the parameter. For example, in monitoring a temperature of a particular component in the processing device, the temperature may be detected to meet or exceed a certain threshold temperature. As a result, the deflection field generator is activated to deflect or redirect at least a portion of the flow of ionized air to provide additional cooling proximate the particular component.

BRIEF DESCRIPTION OF DRAWINGS

The present disclosure is illustrated by way of example and not limitation in the figures of the accompanying drawings, in which like references indicate similar elements and in which.

DETAILED DESCRIPTION

The description that follows includes illustrative systems, methods, techniques, instruction sequences, and computing machine program products that embody the present invention. In the following description, for purposes of explanation, numerous specific details are set forth in order to provide an understanding of various embodiments of the inventive subject matter. It will be evident, however, to one skilled in the art that embodiments of the inventive subject matter may be practiced without these specific details. In general, well-known instruction instances, protocols, structures and techniques have not been shown in detail.

It should be appreciated that for the purposes of this specification, a "processing device" as described herein, refers to a device using one or more processors, microcontrollers, and/ or digital signal processors having the capability of running a "program," which is a set of executable machine code. A program includes user-level applications as well as system-directed applications or daemons. Processing devices include communication and electronic devices such as cell phones, media players, and Personal Digital Assistants (PDA); as well as computers, or "computing devices" of all forms (desktops, laptops, servers, palmtops, tablets, and other computing devices).

Figure 1:
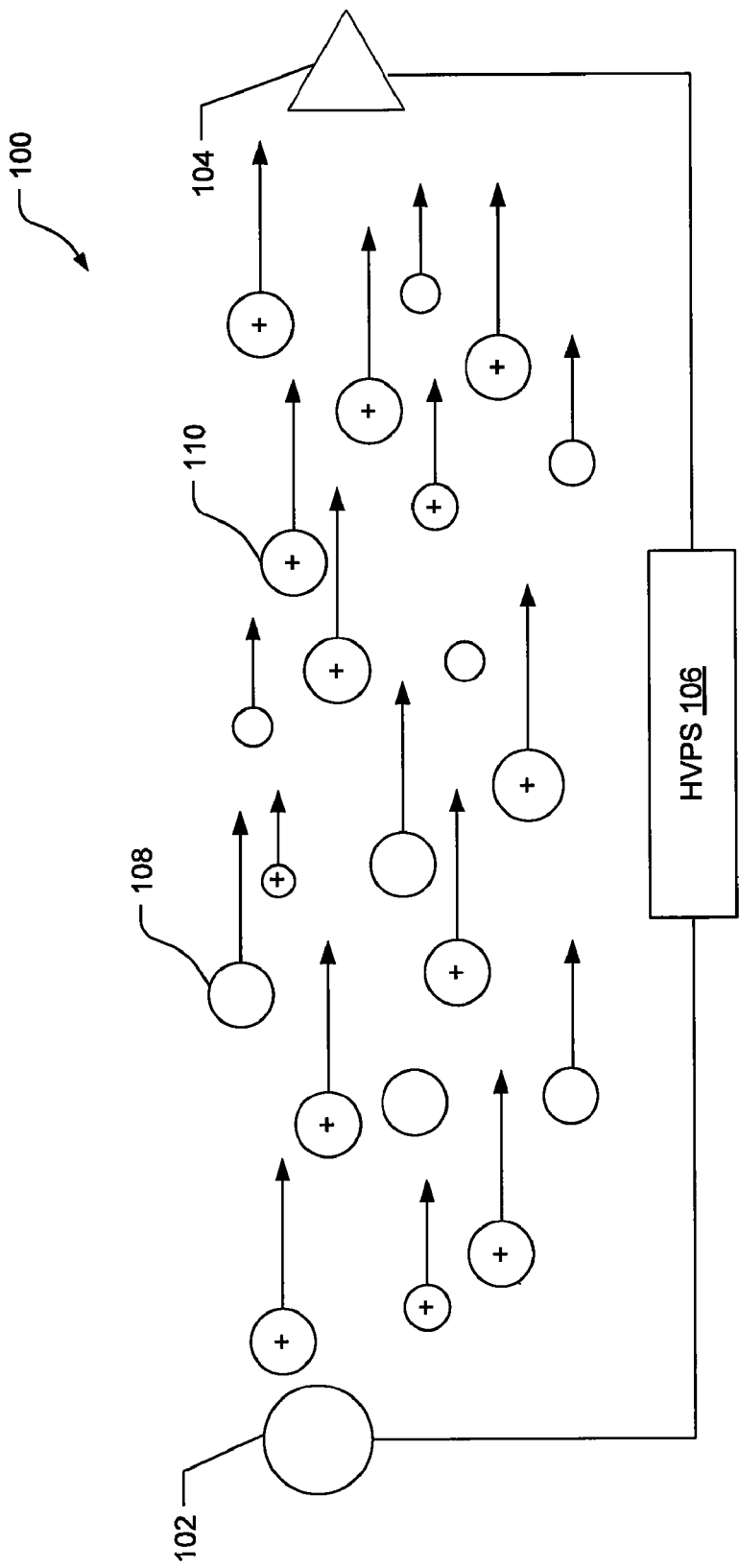
FIG. 1 depicts a diagram illustrating the generation of airflow by an ionic wind pump.

FIG. 1 depicts a diagram illustrating the generation of airflow by an ionic wind generator 100. The basic operating principle of the ionic wind generator 100 is based on corona discharge—an electrical discharge near a charged conductor caused by the ionization of the surrounding air. As depicted, the example of the ionic wind generator 100 includes a corona electrode 102, a collector electrode 104, and a high voltage power supply 106 connected to both the corona electrode 102 and the collector electrode 104.

The high voltage power supply 106 is configured to apply a voltage between the corona electrode 102 and the collector electrode 104 to create a high electric field gradient at the corona electrode 102. This high electric field gradient causes particles in the air (e.g., oxygen and nitrogen molecules) to become ionized (to become charged), and therefore creates a corona or halo of charged particles 110. An electric field propels the charged particles 110, which transfer momentum to neutral air particles 108 by way of collisions, resulting in bulk air movement towards the collector electrode 104. It should be appreciated that the ionic wind generator 100 has little or no moving parts, thereby possibly resulting in improved reliability and reduced noise level when compared to conventional cooling devices with moving parts, such as fans.

Figure 2A:
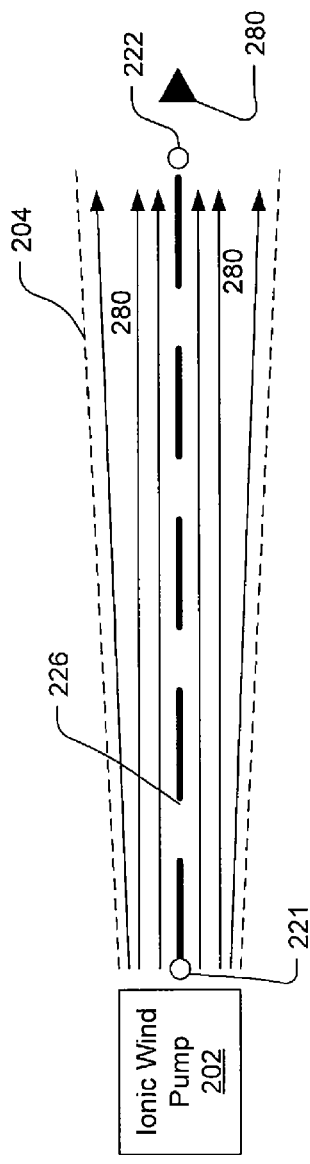
FIGS. 2A and 2B depict diagrams illustrating the use of a deflection field generator to deflect a flow of ionized air, according to an embodiment of the present invention.
Figure 2B:
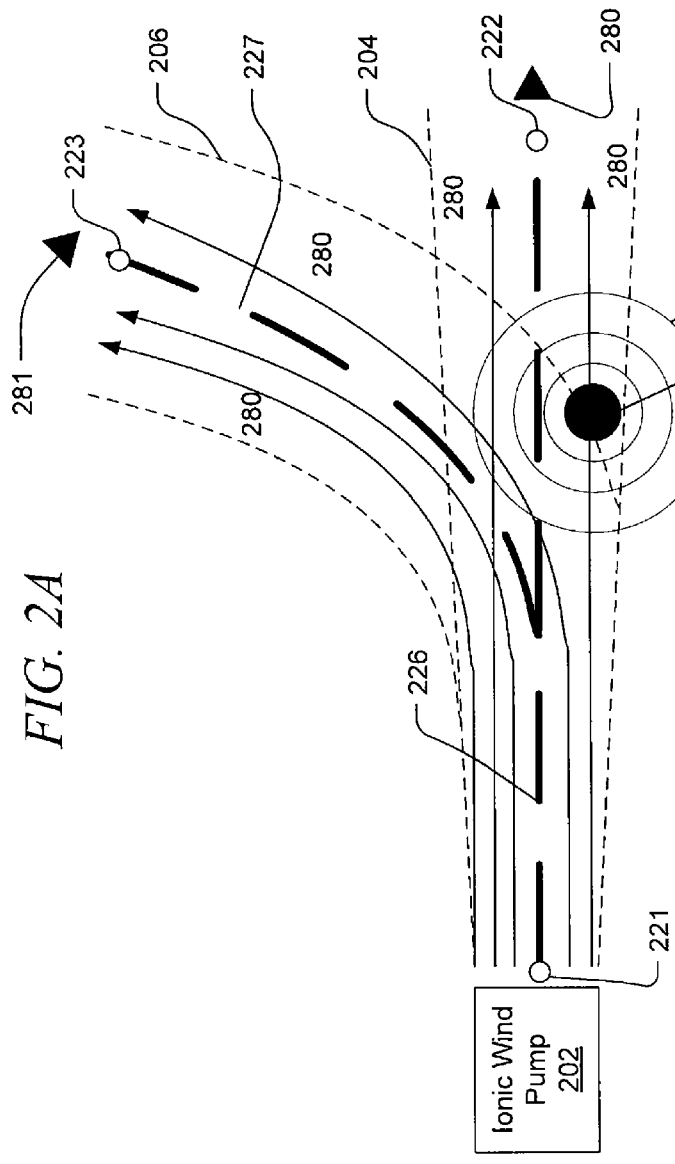

FIGS. 2A and 2B depict diagrams illustrating the use of a deflection field generator to deflect a flow 280 of ionized air, according to an embodiment of the present invention. In FIG. 2A, an ionic wind generator 202 is configured to generate a flow 280 of ionized air along path 204. A "path" refers to a course along which ionized air traverses or flows. The ionized air depicted in FIG. 2A flows along a relatively straight path 204 that is defined along a continuous, straight line 226 that connects two reference points 221 and 222, one of which (reference point 221) is located proximate to the ionic wind generator 202 and the other of which (reference point 222) is located on the continuous line 226 at a distance away from the reference point 221.

In embodiments of the present invention, the flow of ionized air can be deflected or redirected to flow along a different path. As depicted in FIG. 2B, the deflection field generator 208 may be located proximate the path 204 of the flow 280. The deflection field generator 208 is a component or device that can generate a field 210 in the form of an electric field and/or a magnetic field. An example of the deflection field generator 208 is a permanent magnet, which is a magnetized material that creates its own persistent magnetic field. Another example of a deflection field generator 208 is an electromagnet, wherein an electrical current is used to generate an electromagnetic field 210, which includes both an electric field and/or a magnetic field. It should be appreciated that generally, electric and magnetic fields are not completely separate phenomena; what one observer perceives as an electric field, another observer in a different frame of reference may perceive the same field as a mixture of electric and magnetic fields.

For purposes of illustration, embodiments of the present invention will be described in the context of an electromagnetic field that generates a Lorentz force that may be used to deflect the flow of ionized air. The Lorentz force (F) is expressed by:

$$F = q(E + v \times B) \qquad \text{Eq. 1}$$

Where;
q is the charge of an ionized particle,
$E$ is an applied electric field,
$\bar{v}$ is a velocity of an ionized particle, and
$\bar{B}$ is an applied magnetic field.

As expressed in Equation 1 above, the electric field E, the magnetic field B (static or dynamic), or both the electric field and the magnetic field can exert a Lorentz force F on an ionized particle to change the direction of motion of the ionized particle. The electromagnetic field 210 generated by the deflection field generator 208 can be constant or selectively varied.

As depicted in FIG. 2B, the deflection field generator 208 is located proximate the path 204 of the flow 280 and may be activated to generate an electromagnetic field 210 (magnetic and/or electric field), which results in the application of a Lorentz force on the flow 280 of ionized air. The generated electromagnetic field 210 therefore deflects or redirects a portion of the flow 280 of the ionized air from the original path 204 to a different path 206 heading towards a different direction from the original path 204. The magnitude of the deflection is exaggerated here for illustrative purposes. This different path 206 is defined along a continuous curve 227 between reference points 221 and 223. For this path 206 to be different from path 204, the reference point 223 at one point of the path 206 is located at a different location from the reference point 222 at one endpoint of the path 204. As will be apparent to those skilled in the art, and as indicated in FIG. 1, the flow of ionized air will be from ionic wind generator 202 toward one or more collector electrodes 280 and 281. Accordingly, notwithstanding the deflection of some of the airflow from the original path 204 to the deflection path 206, both paths 204 and 206 will eventually extend to the collector electrodes 280 and 281, respectively, in the system.

Figure 3:
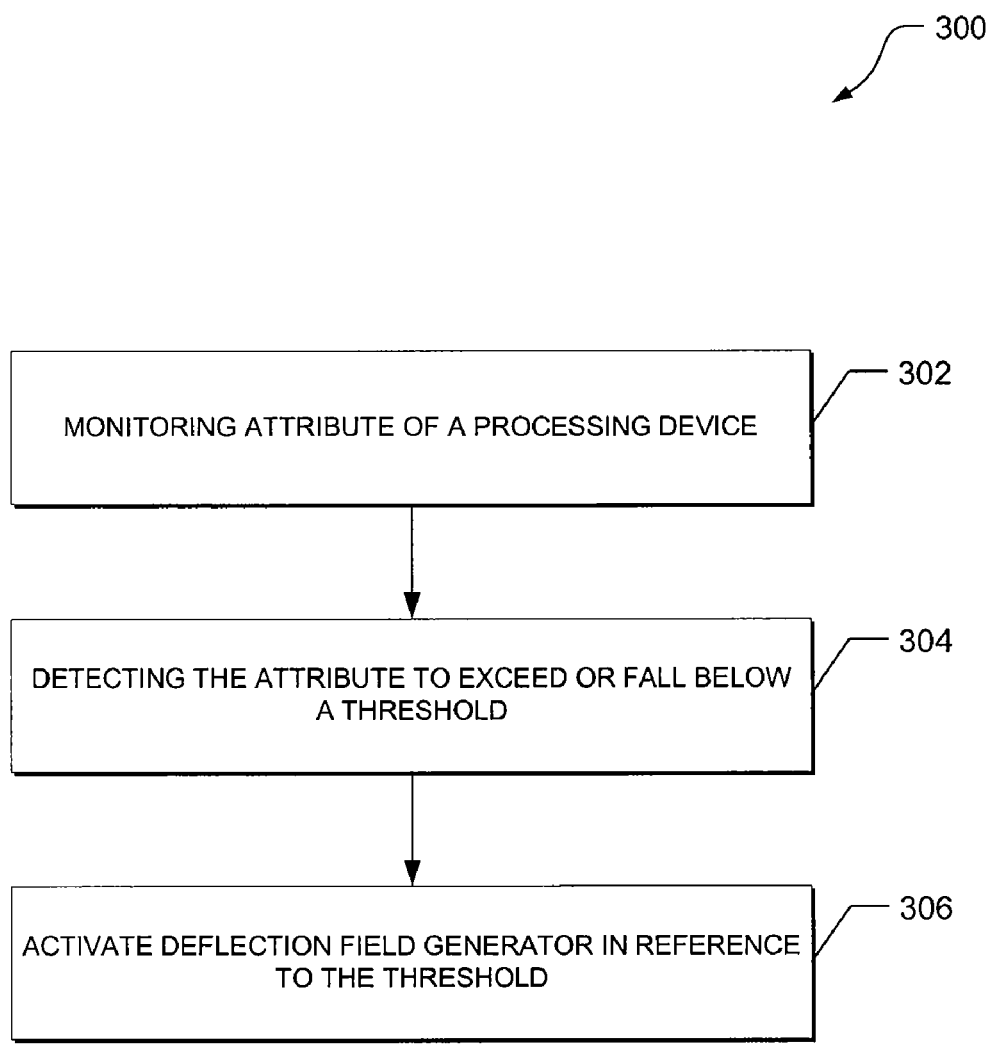
FIG. 3 depicts a flow diagram of a general overview of a method, in accordance with an embodiment, for defecting a flow of ionized air towards a different path.

FIG. 3 depicts a flow diagram of a general overview of a method 300, in accordance with an embodiment, for deflecting a flow of ionized air towards a different path. As noted previously, the deflection of the ionized air flow can be selectively controlled, in some examples, that control can be in response to one or more monitored parameters. An example of one such method is described in reference to FIG. 3. The method 300, in various embodiments, may be implemented either by hardware or by software executed on a processor, a controller, or other controlling devices employed within a processing device, as explained in more detail below. At 302, a parameter of a processing device is monitored. As used herein, a "parameter" refers to a property or characteristic of an area or component of the processing device that can be sensed or monitored through use that appropriate sensor and associated circuitry or processing. Examples of parameters include a temperature of a component, a temperature of a particular region of a processing device, a power consumption of a component, a power consumption of the processing device; and further include any other parameter that might beneficially be monitored to provide data input useful in regulating the cooling system of the processing device.

In monitoring the parameters, detection may be made at 304 that the parameter exceeds or falls below a certain threshold. For example, if the parameter is a temperature of the component, the threshold may be either an upper temperature threshold or a lower temperature threshold. In another example, if the parameter is a power consumption of a component, the threshold may be either an upper threshold power or a lower threshold power. Depending on the type of application, the detection at 304 may be limited to detecting whether the particular parameter being monitored meets or exceeds a certain threshold. Alternatively, the detection at 304 may be limited to detecting whether the particular parameter being monitored falls below a certain threshold. The detection at 304 may also be limited to detecting whether the particular parameter matches a certain threshold.

Still referring to FIG. 3, the deflection field generator is activated at 306 in reference to the threshold defined above. That is, the deflection field generator may be activated if, for example, the parameter is detected to exceed a certain threshold. Alternatively, the deflection field generator may be activated if the parameter is detected to fall below a certain threshold. The activation of the deflection field generator may be implemented in any desired manner, for example, by supplying electrical current to the deflection field generator, or by actuating any other triggers or mechanisms that cause the deflection field generator to generate an electromagnetic field.

Figure 4A:
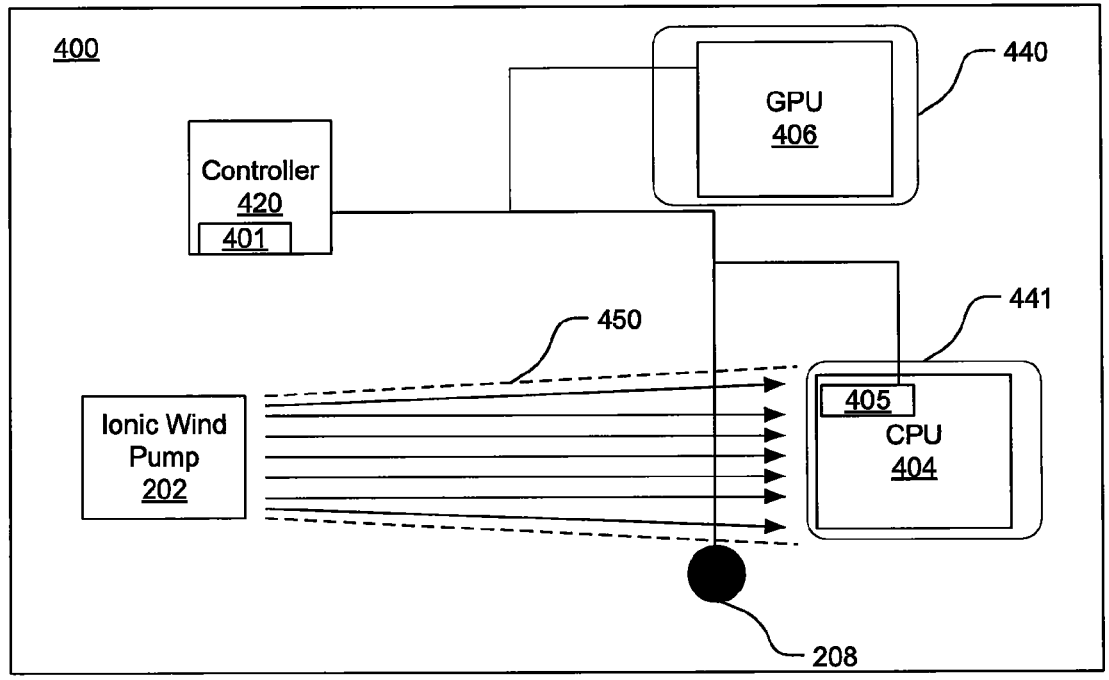
FIGS. 4A and 4B depict schematic diagrams illustrating an ionic wind generator as implemented in a processing device, in accordance with an embodiment of the present invention.
Figure 4B:
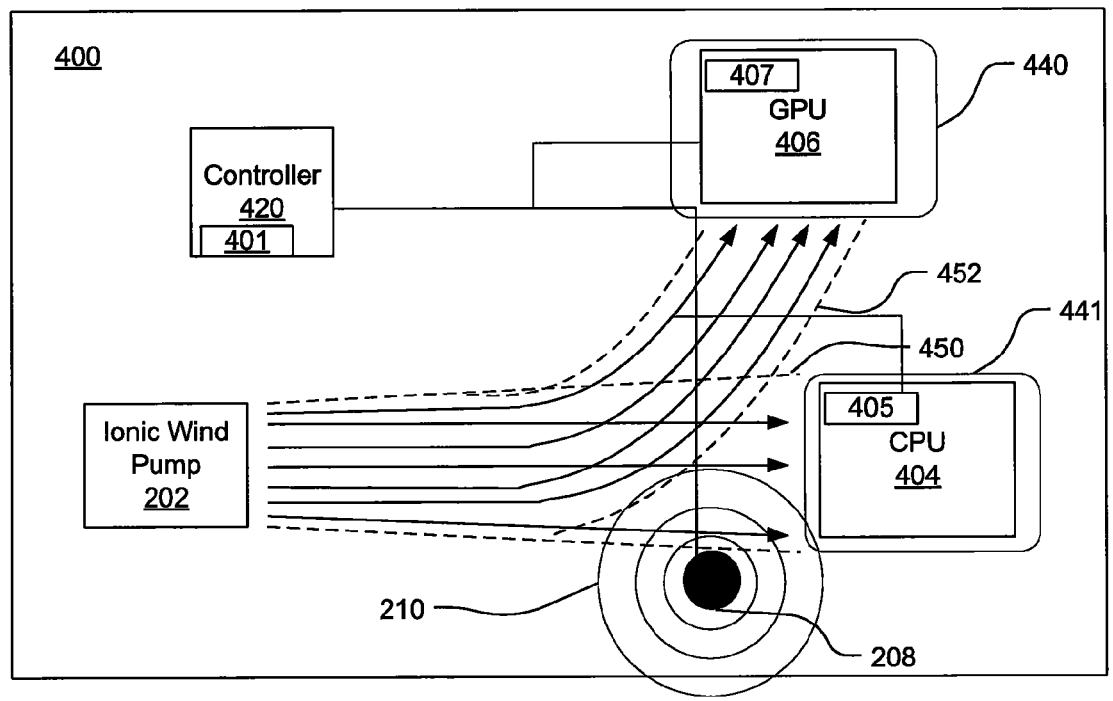

FIGS. 4A and 4B depict schematic diagrams illustrating an ionic wind generator as implemented in a processing device 400, in accordance with an embodiment of the present invention. As depicted, the processing device 400 includes an ionic wind generator 202, a controller 420, a graphics processing unit (GPU) 406, a central processing unit (CPU) 404, and a deflection field generator 208. The processing device 400 also includes temperature sensors 407 and 405 that are configured to sense the temperatures of the graphics processing unit 406 and central processing unit 404, respectively. The control functionality for actuating the ionic wind generator can be implemented by a field generator control module 401. Where the field generator control module 401 includes firmware or software instructions, those instructions may be processed by the controller 420. Additionally, an enclosure of the processing device 400 includes vents 440 and 441 proximate to the graphics processing unit 406 and central processing unit 404, respectively.

In FIG. 4A, the ionic wind generator 202 generates a flow of ionized air along a path 450 towards the central processing unit 404, thereby cooling the central processing unit 404. The vent 441 is also located in the path 450 of the flow to serve as an outlet for heat generated by the central processing unit 404 as carried by the flow of ionized air. The deflection field generator 208 is located proximate to the path 450 of the flow and is in an inactive state. The field generator control module 401, as processed by the controller 420, monitors the temperatures of the graphics processing unit 406 and the central processing unit 404 by way of the temperature sensors 407 and 405, respectively.

As depicted in FIG. 4B, if the field generator control module 401 detects that the temperature of the graphics processing unit 406 exceeds a certain threshold temperature, the field generator control module 401 activates the deflection field generator 208, which generates an electromagnetic field 210, to redirect a portion of the flow towards the graphics processing unit 406. In other words, this electromagnetic field 210 deflects at least a portion of the ionized air flow to a different path 452 directed towards the graphics processing unit 406, thereby cooling the graphics processing unit 406. The vent 440 is also located in this different path 452 of the flow to serve as an outlet for heat generated by the graphics processing unit 406 as carried by the flow of ionized air.

The strength of the electromagnetic field 210 generated by the ionic wind generator 202 depends on a variety of factors specific to the application. Examples of such factors include the amount of ionized air that is to be deflected, the distance between the ionic wind generator 202 and the deflection field generator 208, the proximity of the deflection field generator 208 to the path 450 and/or path 252, the density of particles in the air, and a variety of other factors. Still, as an example, the deflection field generator 208 may generate a magnetic field in the range of 0.001 to $10e^{11}$ gauss to deflect 0.005 to 20 cubic feet/minute of ionized air.

The path 452 may also be redirected to flow in a different direction based on the location of the deflection field generator 208, the strength of the electromagnetic field 210, and the geometry of the electromagnetic field 210. For example, in the embodiment depicted in FIG. 4B, the path 452 may be deflected downwards below the central processing unit 404 by locating the deflection field generator 208 closer to the graphics processing unit 406. Alternatively, multiple deflection field generators may be placed proximate to a path 450 or 452 to change its curvature.

In this embodiment, a component to be cooled (e.g., CPU 405 or CPU 407) can itself function as a collector electrode by applying a suitable voltage between the ionic wind pump 202 and the component. Accordingly, the component draws bulk air movement from the ionic wind pump 202 towards itself. In an alternate embodiment, one or more collector electrodes may be located proximate to the paths 450 and 452 to draw bulk air movement towards the CPU 405 and/or CPU 407.

It should be appreciated that the processing device 400 may include more or different components apart from the graphics processing unit 406 and the central processing unit 404 shown in FIGS. 4A and 4B, and the ionic wind generator 202 may be configured to cool these other components. Accordingly, in other embodiments, the graphics processing unit 406 and/or the central processing unit may be interchanged with other components of the processing device 400. Examples of other components that can be cooled by the ionic wind generator 202 include heat sinks, power sources (batteries), transformers, storage devices, and other components.

Additionally, the field generator control module 401 may include instructions in either software or firmware that are processed by a processor, such as the central processing unit 404. In another example, the field generator control module 401 may be implemented by Application Specific Integrated Circuits (ASICs), which may be integrated into a circuit board. Alternatively, the field generator control module 401 may be in the form of one or more logic blocks included in a programmable logic device (e.g., a field-programmable gate array). The described modules may be adapted, and/or additional structures may be provided, to provide alternative or additional functionalities beyond those specifically discussed in reference to FIGS. 4A and 4B, some of which will be discussed in more detail below. The modifications or additions to the structure of the field generator control module 401 to implement these alternative or additional functionalities will be implementable by those skilled in the art, having the benefit of the present specification and teachings.

Figure 5A:
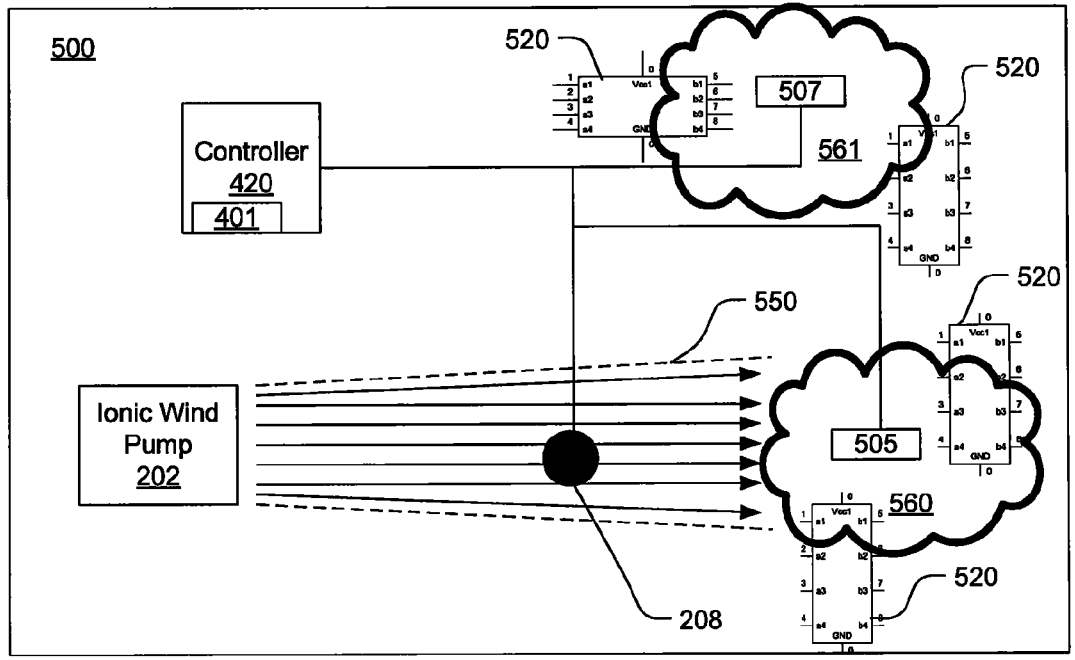
FIGS. 5A and 5B depict schematic diagrams illustrating an ionic wind generator implemented in a different processing device, in accordance with an alternate embodiment of the present invention.
Figure 5B:
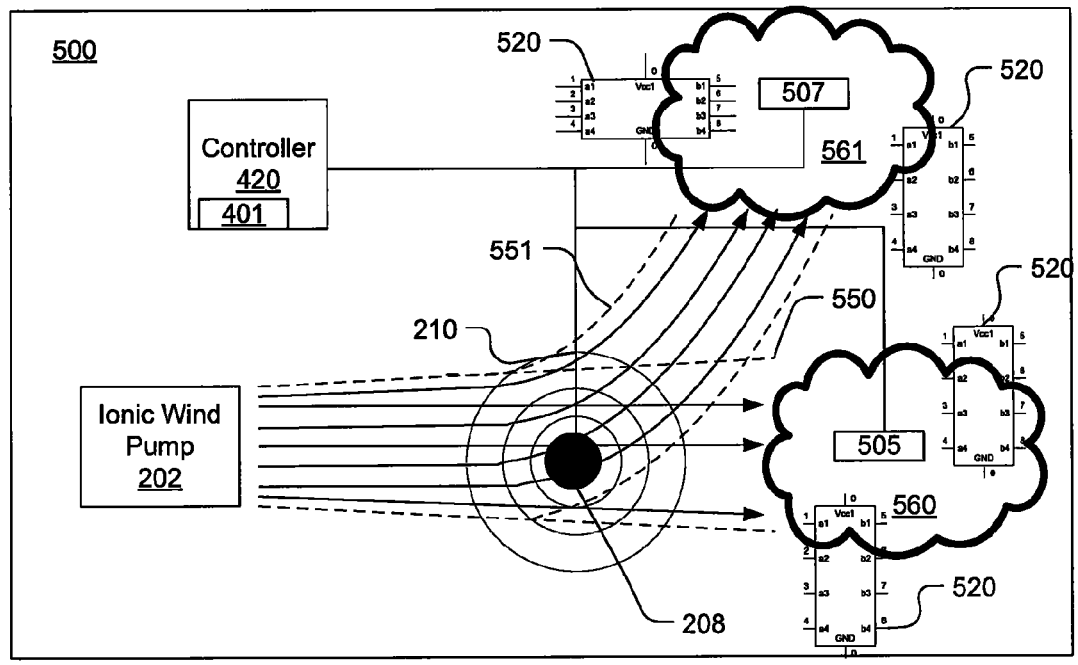

FIGS. 5A and 5B depict schematic diagrams illustrating an ionic wind generator 202 implemented in a different processing device 500, in accordance with an alternate embodiment of the present invention. As depicted in FIGS. 5A and 5B, this embodiment of the processing device 500 includes an ionic wind generator 202, a controller 420, a deflection field generator 208, temperature sensors 507 and 505, and various components 520. Additionally, a field generator control module 401 is processed by the controller 420.

In FIG. 5A, the temperature sensors 505 and 507 are not configured to sense temperatures of any particular component 520 included in the processing device 500. Rather, the temperature sensors 505 and 507 are located within the processing device 500 to detect temperatures of specific regions 560 and 561. As used herein, a "region" of the processing device 500 refers to a space, area, or portion of the processing device 500. In the embodiment of FIG. 5A, the temperature sensor 507 is located within or proximate to region 561 to sense a temperature of the region 561. Similarly, the temperature sensor 505 is located within or proximate to region 560 to sense a temperature of the region 560. In the embodiment depicted in FIGS. 5A and 5B, the regions 560 and 561 may not have precise boundaries and are therefore illustrated using cloud shapes. However, in other embodiments, the regions 560 and 561 may have boundaries that are more precise if the processing device 500 includes specific sections, as may be defined by one or more physical barriers, that thermally isolate one section from another section.

In FIG. 5A, the ionic wind generator 202 generates a flow of ionized air along a path 550 towards the region 560, thereby cooling the region 560. The deflection field generator 208 is located proximate to the path 550 of the flow and is in an inactive state. The field generator control module 401 monitors the temperatures of regions 560 and 561 by way of the temperature sensors 505 and 507. As depicted in FIG. 5B, if the field generator control module 401 detects that the temperature of the region 561 exceeds a certain threshold temperature, the field generator control module 401 activates the deflection field generator 208, which generates an electromagnetic field 210. This electromagnetic field 210 deflects at least a portion of the ionized air flow to a different path 551 towards the region 561, thereby cooling the region 561.

It should be noted that in an embodiment, an enclosure of the processing device 500 may include vents (not shown) that allow the ionized air to flow away from the processing device 500. For example, the processing device 500 may include vents located in the path of the flow or proximate to regions 560 and 561. As a result, the flow of ionized air along paths 550 and 551 can exit through their respective vents.

Figure 6A:
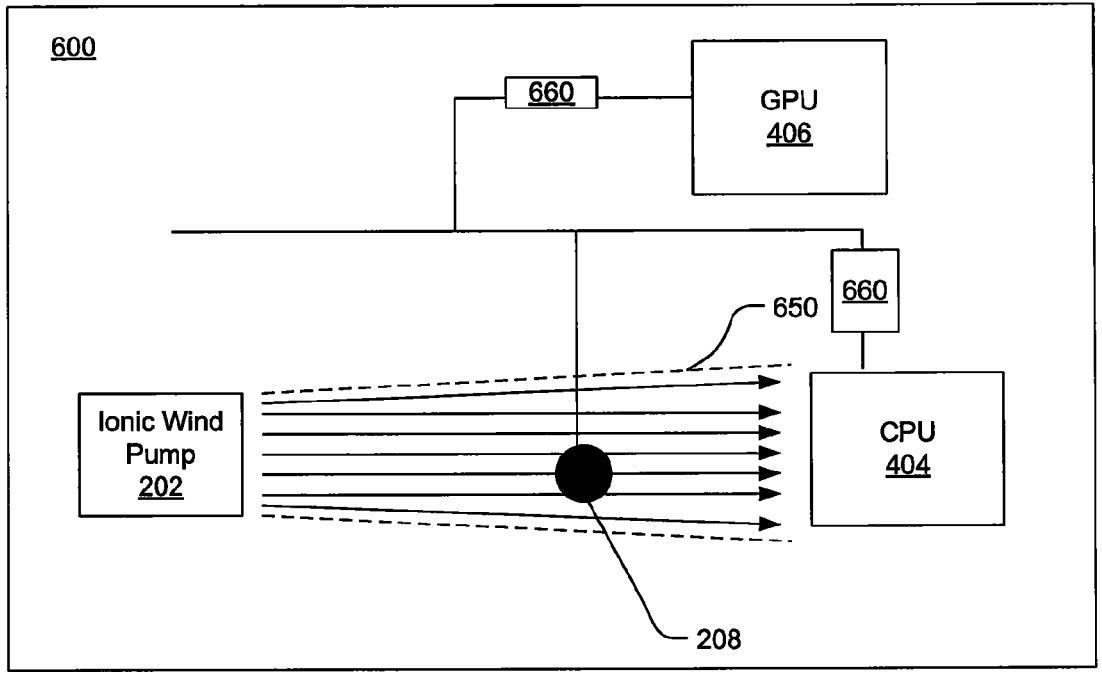
FIGS. 6A and 6B depict schematic diagrams illustrating an ionic wind generator implemented in another processing device, in accordance with yet another embodiment of the present invention.
Figure 6B:
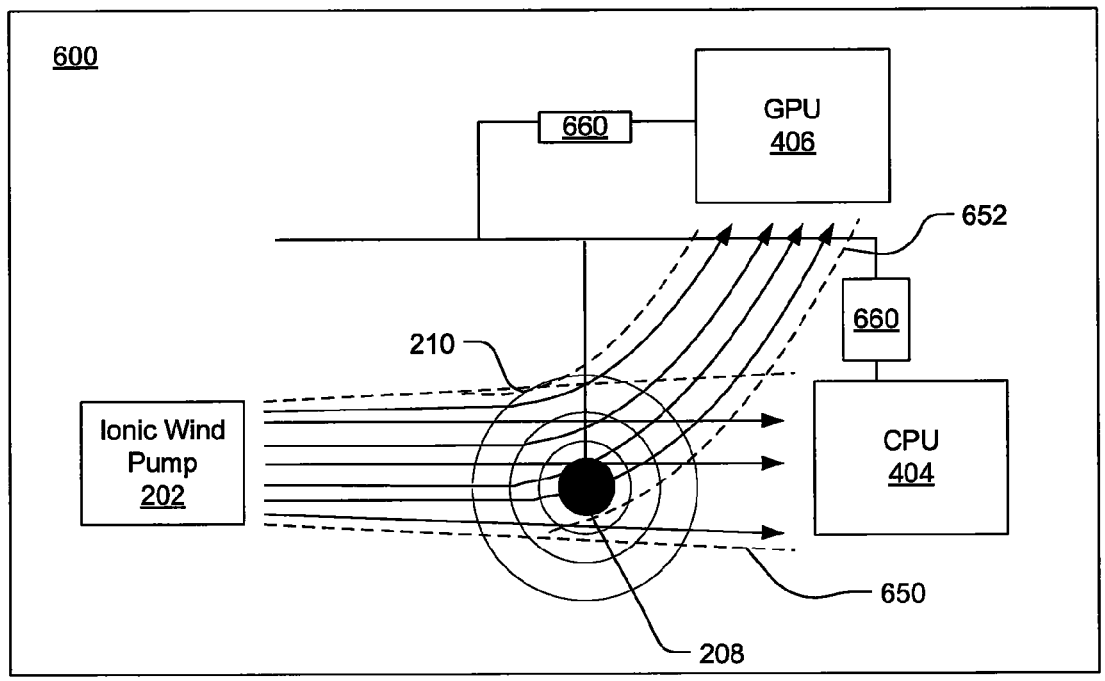

FIGS. 6A and 6B depict schematic diagrams illustrating an ionic wind generator 202 implemented in another processing device 600, in accordance with yet another embodiment of the present invention. As depicted in FIGS. 6A and 6B, this alternate embodiment of the processing device 500 includes an ionic wind generator 202, a graphics processing unit 406, a central processing unit 404, and a deflection field generator 208. Additionally included in the processing device 600 are power consumption sensors 660 and 661 that sense the power consumptions of the graphics processing unit 406 and the central processing unit 404, respectively. A power meter is an example of such a power consumption sensor 660 or 661.

In FIG. 6A, the ionic wind generator 202 generates a flow of ionized air along a path 650 towards the central processing unit 404, thereby cooling the central processing unit 404. Similarly, the deflection field generator 208 is located in the path 650 of the flow and is in an inactive state. In this embodiment, a software application provides instructions to central processing unit 404 to monitor the individual power consumption of the graphics processing unit 406 and the central processing unit 404. As depicted in FIG. 6B, if the software application detects that the power consumption of the graphics processing unit 406 exceeds a certain threshold power, the software application activates the deflection field generator 208, which generates an electromagnetic field 210. This electromagnetic field 210 deflects at least a portion of the ionized air flow to a different path 652 directed towards the graphics processing unit 406, thereby cooling the graphics processing unit 406, which may be drawing more power and therefore, may need increased cooling.

In one embodiment, the deflection field generator 208 can also be modulated to vary the electromagnetic field 210 with time. In general, fluid flow over a solid surface, such as a surface of the CPU 404, the GPU 406, or other components, develops a boundary layer, which is characterized by a "no slip" condition (or zero fluid velocity) at the surface and the mean free stream velocity at the outer reaches from the surface. Such a boundary layer thickness is characterized by a distance from the surface where, for example, a local velocity is 0.99 of the mean free stream velocity. A general characteristic of this boundary layer is that it grows in thickness in the direction of the flow. Similarly, convection heat transfer from a solid surface also has a thermal boundary layer that grows in thickness, but varies based on boundary conditions such as uniform surface temperature, uniform wall flux, and other conditions. For a uniformly heated surface, the heat transfer for one dimensional steady state laminar flow at any point X can be represented as:

$$Nu_x \approx 0.332 Pr^{\frac{1}{3}} Re_{x^{\frac{1}{2}}} \qquad \text{Eq. 2}$$

where $Nu_x$ is the Nusselt number at position X, Pr is the Prandtl number, and the $Re_x$ is the Reynolds number at distance X. The Nusselt number can also be expressed as:

$$Nu = \frac{hx}{k} \qquad \text{Eq. 3}$$

where hx is the heat transfer coefficient and k is the thermal conductivity. According to Equations 2 and 3, the heat transfer coefficient hx has roughly an inverse relationship to distance X, which is the distance in the direction of flow from a leading edge of a surface.

To minimize or eliminate the thermal boundary layer over a surface of a component, the deflection field generator 208 can be modulated to create a time-varying electromagnetic field 210. The deflection field generator 208 can be modulated by varying the waveform of the current supplied to the deflection field generator 208. The resulting time-varying electromagnetic field 210 also causes the flow of ionized air along paths 650 and/or 652 to modulate. Such modulation of the flow of ionized air disturbs the flow such that more numerous and shorter length (and hence thinner) thermal boundary layers may be established along a surface of a component in the flow direction. Particularly, the time-varying electromagnetic field 210 disturbs the flow of ionized air by introducing, for example, eddy currents, turbulent flows, two and three dimensional local currents, and/or non-steady state flows. As a result of the modulation, the local heat transfer convection coefficient of the ionized air may be higher over a cooling surface area of a component, thereby possibly increasing local heat transfer.

Figure 7:
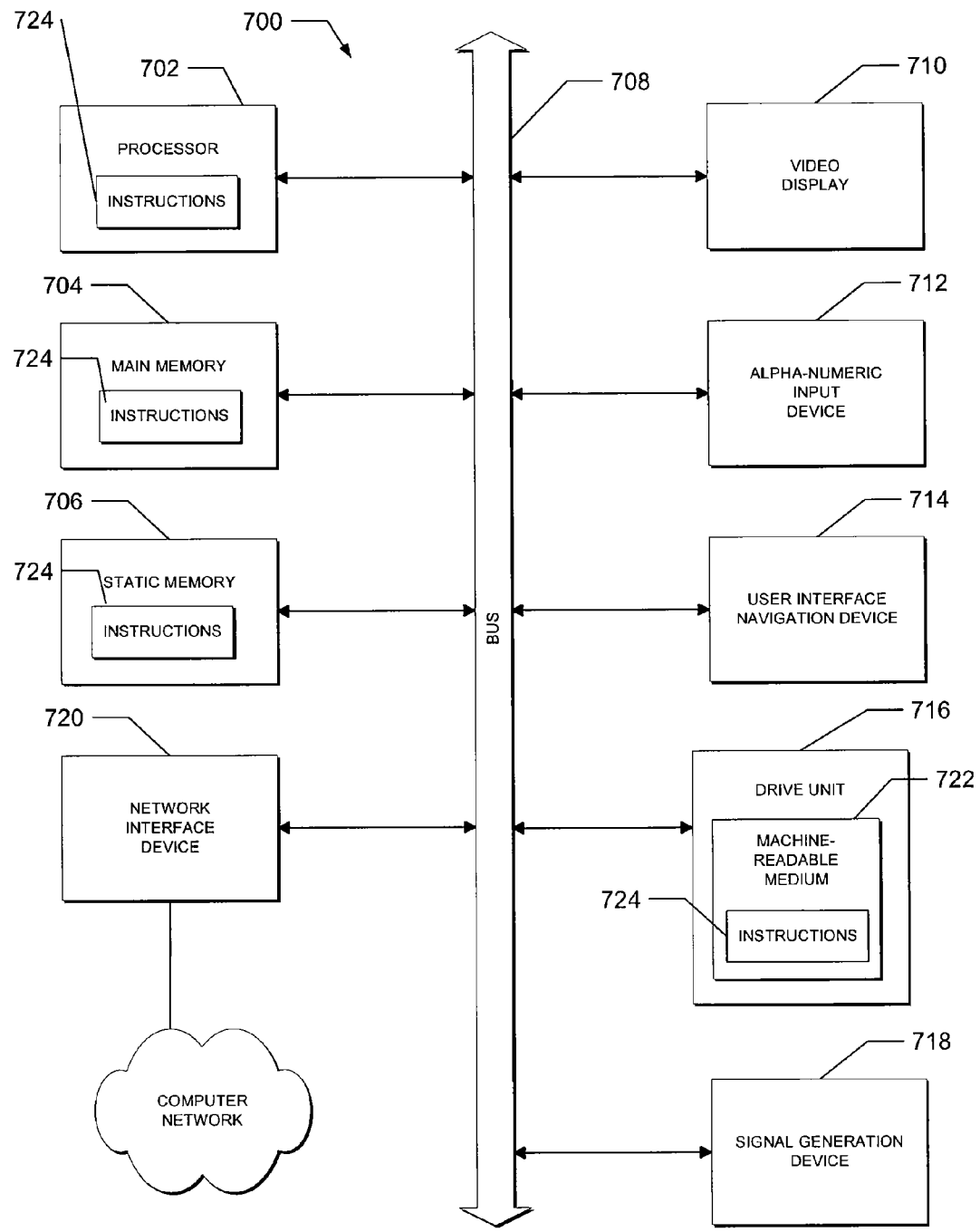
FIG. 7 depicts a simplified block diagram of a machine in the example form of a processing device within which a set of instructions, for causing the machine to perform any one or more of the methodologies discussed herein, may be executed.

FIG. 7 depicts a simplified block diagram of a machine in the example form of a processing device 700 within which a set of instructions, for causing the machine to perform any one or more of the methodologies discussed herein, may be executed. While only a single machine is illustrated, the term "machine" shall also be taken to include any collection of machines that individually or jointly execute a set (or multiple sets) of instructions to perform any one or more of the methodologies discussed herein.

The example of the processing device 700 includes a processor 702 (e.g., a central processing unit, a graphics processing unit or both), main system memory 704 and static memory 706, which communicate with each other via bus 708. The processing device 700 may further include video display unit 710 (e.g., a plasma display, a liquid crystal display (LCD) or a cathode ray tube (CRT)), a user interface (UI) navigation device 714 (e.g., a mouse), a disk drive unit 716, a signal generation device 718 (e.g., a speaker), and a network interface device 720.

The disk drive unit 716 includes machine-readable medium 722 on which is stored one or more sets of instructions and data structures (e.g., software 724) embodying or utilized by any one or more of the methodologies or functions described herein. Software 724 may also reside, completely or at least partially, within the main system memory 704 and/or within the processor 702 during execution thereof by the processing device 700, with the main system memory 704 and the processor 702 also constituting machine-readable, tangible media.

While machine-readable medium 722 is shown in an example embodiment to be a single medium, the term "machine-readable medium" should be taken to include a single medium or multiple media (e.g., a centralized or distributed database, and/or associated caches) that store the one or more sets of instructions. The term "machine-readable medium" shall also be taken to include any medium that is capable of storing, encoding or carrying a set of instructions for execution by the machine and that cause the machine to perform any one or more of the methodologies of the present application, or that is capable of storing, encoding or carrying data structures utilized by or associated with such a set of instructions. The term "machine-readable medium" shall accordingly be taken to include, but not be limited to, solid-state memories, optical and magnetic media, and carrier wave signals.

Certain systems, apparatus or processes are described herein as being implemented in one or more "modules." As used herein, a "module" is a unit of distinct functionality that is performed through software, firmware, hardware, or any combination thereof. When the functionality of a module is performed in any part through software or firmware, the module includes at least one machine readable medium bearing instructions that when executed by one or more processors, performs that portion of the functionality implemented in software or firmware.

While the invention(s) is (are) described with reference to various implementations and exploitations, it will be understood that these embodiments are illustrative and that the scope of the invention(s) is not limited to them. In general, the techniques for deflecting an ionized air stream can be implemented with other specific systems consistent with the hardware systems described herein. Many variations, modifications, additions, and improvements are possible.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the invention(s). In general, structures and functionality presented as separate components in the exemplary configurations may be implemented as a combined structure or component. Similarly, structures and functionality presented as a single component may be implemented as separate components. These and other variations, modifications, additions, and improvements fall within the scope of the invention(s).

What is claimed is:

1. A processing device comprising:
   an ionic wind generator configured to generate a flow of ionized air along a path; and
   a deflection field generator located proximate the path of the flow, the deflection field generator configured to generate an electromagnetic field that deflects at least a portion of the flow of the ionized air to a different path.

2. The processing device of claim 1, wherein the electromagnetic field exerts a Lorentz force on the at least the portion of the flow of the ionized air.

3. The processing device of claim 1, wherein the processing device comprises an enclosure having a vent, and wherein the vent is located in the path of the flow.

4. The processing device of claim 1, wherein the processing device comprises an enclosure having a first vent and a second vent, and wherein the first vent is located in the path of the flow and the second vent is located in the different path of the flow.

5. The processing device of claim 1, further comprising a first component and a second component, wherein the first component is located proximate the path and the second component is located proximate the different path.

6. The processing device of claim 5, wherein the at least the portion of the flow is deflected to cool the second component.

7. A processing device comprising:
   a first component;
   a second component;
   an ionic wind generator configured to generate a flow of ionized air towards the first component;
   a deflection field generator located between the ionic wind generator and the first component; and
   a controller connected to the deflection field generator, the controller to activate the deflection field generator to generate an electromagnetic field that redirects at least a portion of the flow of the ionized air towards the second component.

8. The processing device of claim 7, further comprising a temperature sensor connected to the controller, wherein the temperature sensor is configured to sense a temperature of the second component, and wherein the controller is configured to activate the deflection field generator if the temperature exceeds a threshold temperature.

9. The processing device of claim 7, further comprising a power consumption sensor connected to the controller, wherein the power consumption sensor is configured to sense a power consumed by the second component, and wherein the controller is configured to activate the deflection field generator if the power exceeds a threshold power.

10. The processing device of claim 7, wherein the first component is a central processing unit.

11. The processing device of claim 7, wherein the second component is a graphics processing unit.

12. A method of redirecting a flow of ionized air along a path from an ionic wind generator, the method comprising:
   monitoring an parameter of a processing device; and
   activating a deflection field generator in reference to a threshold associated with the parameter, the activation of the deflection field generator generating an electromagnetic field that redirects at least a portion of the flow of the ionized air towards a different path.

13. The method of claim 12, further comprising detecting the parameter to exceed the threshold.

14. The method of claim 12, further comprising detecting the parameter to fall below the threshold.

15. The method of claim 12, wherein the parameter is a temperature of a component included in the processing device, and wherein the threshold is a threshold temperature.

16. The method of claim 12, wherein the parameter is a temperature of a region of the processing device, and wherein the threshold is a threshold temperature.

17. The method of claim 12, wherein the parameter is a power consumption of a component included in the processing device, and wherein the parameter is a threshold power.

18. The method of claim 12, further comprising modulating the deflection field generator to vary the electromagnetic field with time.

* * * * *